United States Patent
Auracher et al.

(10) Patent No.: US 6,377,592 B1
(45) Date of Patent: Apr. 23, 2002

(54) METHOD FOR STABILIZING THE WAVELENGTH OF A LASER AND ARRANGEMENT FOR IMPLEMENTING SAID METHOD

(75) Inventors: Franz Auracher, Baierbrunn; Reinhard März, München, both of (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/402,041

(22) PCT Filed: Mar. 12, 1998

(86) PCT No.: PCT/DE98/00737

§ 371 Date: Sep. 27, 1999

§ 102(e) Date: Sep. 27, 1999

(87) PCT Pub. No.: WO98/43327

PCT Pub. Date: Oct. 1, 1998

(30) Foreign Application Priority Data

Mar. 26, 1997 (DE) .......................... 197 12 845

(51) Int. Cl.[7] .............. H01S 3/10; H01S 3/13; H01S 3/00
(52) U.S. Cl. ............. 372/9; 372/29.011; 372/29.014; 372/29.02; 372/29.021; 372/38.01
(58) Field of Search ............... 372/9, 32, 20, 372/34, 29.02, 29.011, 38.01, 29.01, 29.014, 29.021

(56) References Cited

U.S. PATENT DOCUMENTS

| 5,019,769 A | * | 5/1991 | Levinson | 372/31 |
| 5,287,367 A | * | 2/1994 | Yanagawa | 372/31 |
| 5,299,212 A | * | 3/1994 | Koch et al. | 372/32 |

FOREIGN PATENT DOCUMENTS

| DE | 40 31 372 | 4/1992 |
| DE | 44 29 748 | 3/1995 |
| EP | 0 284 908 | 10/1988 |
| EP | 0 660 467 | 6/1995 |
| WO | 95/29521 | 11/1995 |

OTHER PUBLICATIONS

Japanese Abstract, 63119284, May 23, 1988.
Japanese Abstract, 05198883, Aug. 6, 1993.
Japanese Abstract, 04342183, Nov. 27, 1992.
Japanese Abstract, 57037893, Mar. 2, 1982.

* cited by examiner

*Primary Examiner*—Frank G. Font
*Assistant Examiner*—Armando Rodriguez
(74) *Attorney, Agent, or Firm*—Schiff Hardin & Waite

(57) ABSTRACT

In the method and the arrangement, a ratio (p2/P3)—which is independent of the total optical power of the laser (1)—between a power (p2) essentially containing only the wavelength ($\lambda$) to be stabilized, which power is filtered out from a portion (P2) of the total power (P0), and an additional portion (P3) is measured and compared to a desired value (S0), and, given a deviation from the desired value (S0), the temperature of the laser (1) is controlled to the desired value (S0).

15 Claims, 5 Drawing Sheets

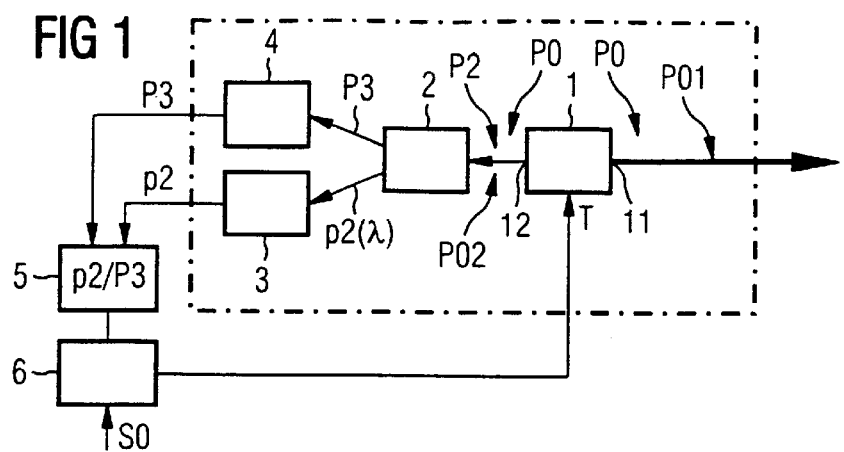
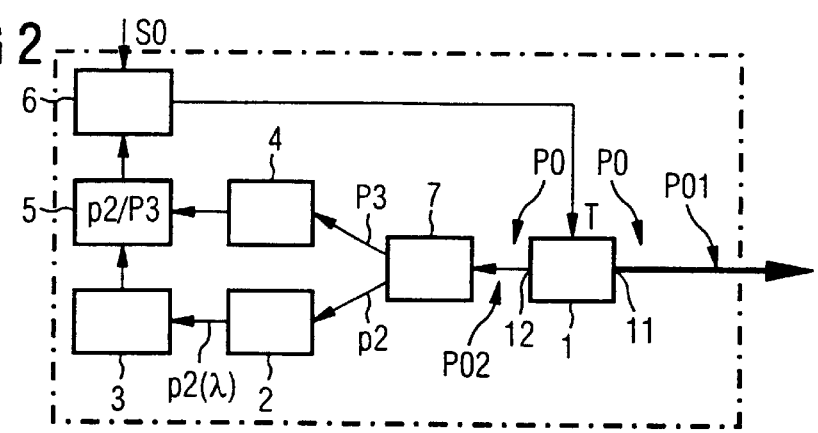
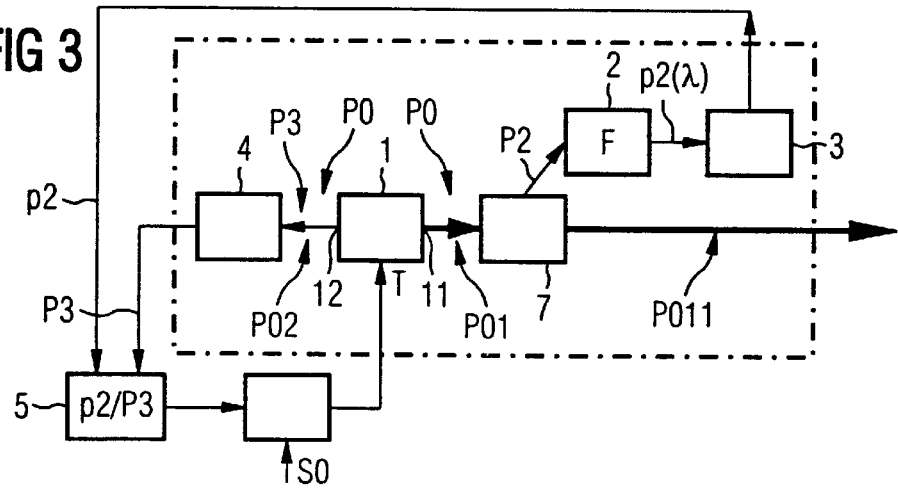

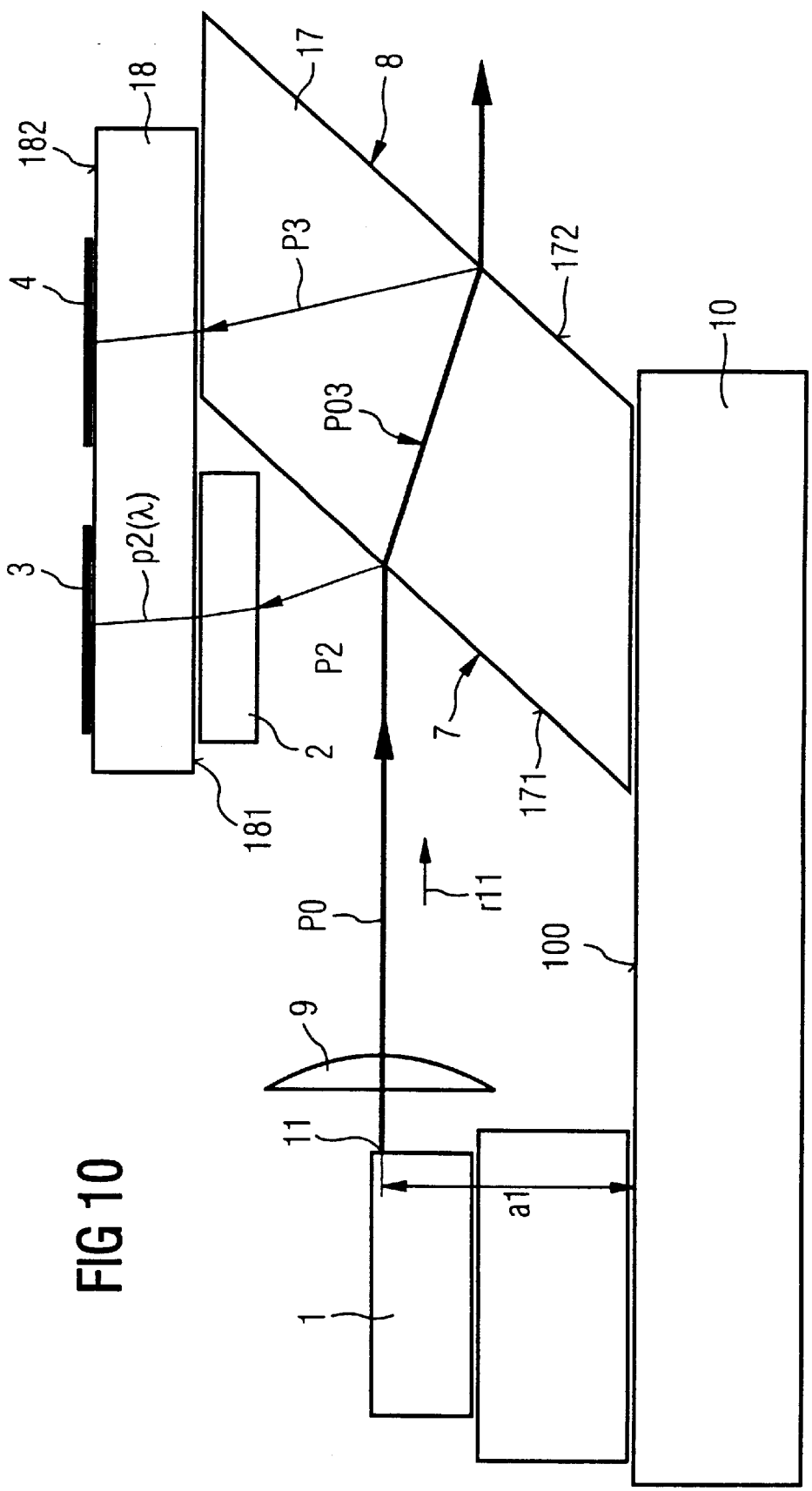

METHOD FOR STABILIZING THE WAVELENGTH OF A LASER AND ARRANGEMENT FOR IMPLEMENTING SAID METHOD

BACKGROUND OF THE INVENTION

1. Field of the Invention

The present invention relates to a method for wavelength stabilization of a laser, particularly a semiconductor laser.

2. Description of the Related Art

Laser modules containing semiconductor lasers for optical transmission systems with wavelength division multiplex technology (WDM technology) must hold their wavelength very stable during their entire required lifetime ($10^5$ hours!), so that the transmitting characteristics in the wavelength channel do not change unacceptably, or respectively, so that crosstalk onto neighboring channels does not occur. At the moment, WDM systems with 4 and 8 wavelength channels with a channel interval of 400 Ghz (which corresponds to 3.2 nm), or respectively, 200 Ghz (which corresponds to 1.6 nm) are used. However, the number of wavelength channels will shortly increase to 16, and to 32 to 64 channels in the medium term, the channel spacing growing smaller according to the rising number of channels.

In the laser modules used today, the fine adjustment and stabilization of the wavelength is effected exclusively via the temperature of the laser diode. The typical change in the wavelength for 1.5-$\mu$m semiconductor lasers is 0.1 nm/K of the temperature change, for example. This indirect wavelength stabilization has the disadvantage that it does not take aging effects of the laser diode into account. Leading manufacturers of laser modules currently guarantee a wavelength stability of 0.3 nm within the lifetime. This value is not sufficient for future high-performance WDM transmission systems with a smaller channel spacing, however.

SUMMARY OF THE INVENTION

By contrast, the invention proposed here has the advantage that a simple, direct wavelength stabilization of a semiconductor laser is made available on the basis of ratio control, it being possible to use this stabilization particularly in laser modules containing semiconductor lasers for optical transmission systems with WDM technology, though it is not limited to such lasers and can be used with essentially any type of laser.

In order to reliably measure the emitted wavelength, an optical filter is additionally inventively used, which can be advantageously installed in a laser module. Since the filter is a passive component, a high long-term wavelength stability can generally be achieved.

Preferable and advantageous developments of the inventive method provide for wavelength stabilization of a laser, particularly a semiconductor laser, in that a power portion of a total optical power is fed to an optical filter which is wavelength-selective and which is set at a wavelength that is to be stabilized, which filter filters out a power containing essentially only this wavelength from this supplied optical power portion, an additional power portion is derived from the total optical power emitted by the laser such that a ratio between the filtered-out power and this additional power portion is independent of this total power, the filtered-out and additional power portion are respectively measured, the ratio is formed between the measured filtered-out power portion and the measured additional power portion, the formed ratio is compared as an actual value to an adjustable desired value of this ratio, and given the deviation of the actual value from the respectively set desired value, an operating parameter of the laser on which on the wavelength to be stabilized depends is so adjusted that the actual value essentially matches the adjusted desired value.

An improvement provides that a power portion to be filtered, which is proportional to the total power, is fed to the filter, and a part of the supplied power portion to be filtered which is emitted by the filter in addition to the filtered-out power is used as an additional power portion, whereby the sum of this additional power portion and the filtered-out power is equal to or at least proportional to the supplied power portion that is to be filtered. It is preferred that a filter selected from the group of optical interference filters and Bragg gratings is used as the filter. Alternatively, a filter selected from the group of wavelength-selective optical directional couplers and interferometers is used as the filter to an output port.

In one embodiment, a power portion to be filtered out, which is proportional to the total optical power of the laser, is fed to the filter; the power which is filtered out by this filter and which essentially contains only the wavelength to be stabilized is fed to one detector; and a power portion which is derived from the total power and which is proportional to this total power is fed to the additional detector as an additional power portion, this power portion being separated from the power portion to be filtered by the filter and remaining unfiltered. According to a development of the invention, the temperature of the laser is adjusted as the operating parameter.

Preferable and advantageous developments of the inventive arrangement provide for a wavelength-selective optical filter which is set at the wavelength to be stabilized, to which filter a power portion, which is to be filtered out, of the total optical power emitted by the laser is fed and which filters out of this supplied power portion a power essentially containing only the wavelength to be stabilized, an optical detector, to which the filtered-out power is fed for purposes of detection, an additional optical detector, to which an additional optical power portion is fed for detection, this power portion being so derived from the emitted total optical power that a ratio between the filtered-out power and the additional power portion is independent of the total power, a means for forming the ratio between the detected filtered-out power and the detected additional power portion, and a means for comparing the formed ratio as an actual value to an adjustable desired value of this ratio and for adjusting an operating parameter of the laser on which the wavelength to be stabilized depends, given a deviation of the actual value from the adjusted desired value, such that the actual value essentially agrees with the adjusted desired value.

In a preferred embodiment, a power portion that is to be filtered which is proportional to the total power is fed to the filter, and a part of the supplied power portion to be filtered which is emitted by the filter in addition to the filtered-out power is conducted to the additional detector as an additional power portion, whereby the sum of this additional power portion and the filtered-out power is equal to, or at least proportional to, the supplied power portion to be filtered.

The filter consists of a filter selected from the group of optical interference filters and Bragg gratings, the power which is filtered out from the supplied power portion to be filtered and which essentially contains only the wavelength to be stabilized is fed to a detector, and the remaining part of the supplied power portion to be filtered, which part is emitted by this filter and is essentially free of the wavelength to be stabilized, is fed to the additional detector as the additional power portion. Alternatively, the filter consists of a filter selected from the group of wavelength-selective optical directional couplers and interferometers, whereby this filter comprises an input port for purposes of coupling into the filter the supplied power portion to be filtered; an output port for coupling out of the filter a power that is filtered out of the power portion that was coupled in for filtering and that essentially contains only the wavelength to be stabilized; and an additional output port for purposes of coupling out of the filter the remaining part of the power portion that was coupled in for filtering, which part forms the additional power portion, and the power that is filtered out from the output port is fed to the detector, and the additional power portion, which is coupled out from the other output port, is fed to the additional detector.

Preferably, a power portion to be filtered, which is proportional to the total optical power of the laser, is fed to the filter; the power, which is filtered out by this filter from supplied power portion that is to be filtered and which essentially contains only the wavelength to be stabilized, is fed to one detector; and a power portion which is derived from the total power and which is proportional to this total power is fed to the additional detector as an additional power portion, this power portion being separated from the power portion to be filtered by the filter and remaining unfiltered by this filter. A wavelength-neutral optical power divider is provided, to which an optical power of the laser that is proportional to the total power is fed and which generates two power portions from this supplied power, one of which is fed to the filter as the power portion to be filtered.

In one embodiment, the laser comprises two light exit windows for purposes of respectively emitting a respective subpower of the total optical power generated by the laser, whereby the subpower from a light exit window is intended for use; the subpower from the other light exit window, which is proportional to the total power, is fed to the filter as the power portion to be filtered; the filter splits the supplied power portion that is to be filtered into the filtered-out power, which essentially contains only the wavelength to be stabilized, and the remaining part of this supplied power portion that is to be filtered, which part forms the additional power portion; and the filtered-out power is fed to the detector and the additional power portion is separated from the filtered-out power and fed to the additional detector.

In one embodiment, the laser comprises two light exit windows for purposes of respectively emitting a respective subpower of the total optical power generated by the laser, whereby the subpower from a light exit window is intended for use; the subpower from the other light exit window, which is proportional to the total power, is fed to the wavelength-neutral power divider, which generates two power portions from this subpower, one of which is fed to the filter as the power portion to be filtered out, and the other of which is fed to the additional detector as the additional power portion; and the power portion that is filtered out from the supplied power portion which is to be filtered, which essentially contains only the wavelength that is to be stabilized, is fed to a detector. Alternately, the laser comprises two light exit windows for purposes of respectively emitting a respective subpower of the total optical power generated by the laser, whereby the subpower from a light exit window is intended for use; the subpower from the light exit window which is intended for use is fed to the wavelength-neutral power divider, which generates two power portions from this subpower, one of which is fed to the filter as the power portion to be filtered out, and the other of which is available for use, whereby the power which is filtered by the filter out of the supplied power portion that is to be filtered and which essentially contains only the wavelength to be stabilized is fed to the detector; and the subpower from the other light exit window, which is proportional to the total power, is fed to the additional detector as the additional power portion.

The laser of another embodiment comprises a light exit window for purposes of emitting an optical power that is proportional to the total power, said optical power being intended for use, this generated power portion is fed to an additional wavelength-neutral power divider, which, in turn, splits this power portion into two power portions, one of which is intended for use; the other power portion that is generated by one of the two power dividers is fed to the filter for filtering, and the power, which is filtered out by this filter from this power portion that is to be filtered and which essentially contains only the wavelength to be stabilized, is fed to the detector; and the additional power portion generated by the other power divider is fed to the additional detector as the additional power portion.

In the present apparatus, the optical power may either penetrate an optical lens or is deflected by a deflecting mirror. A particular advantage of the inventive arrangement can be seen in the design on which it is based, which permits an uncomplicated integration with a semiconductor laser, or in a whole transmission module on the surface of a substrate, using simple conventional production techniques.

The invention is preferably used in optical transmission modules with semiconductor lasers for purposes of long-term stabilization of a wavelength of the laser. Optical fixed-frequency sources for sensor technology can advantageously be realized with the invention.

BRIEF DESCRIPTION OF THE DRAWINGS

The invention is detailed below with the aid of the Figures.

FIGS. 1 to 4 depict four different basic embodiments of the inventive arrangement, in greatly simplified block diagrams.

FIG. 10 depicts a schematic sectional view of a realization of a development of the embodiment according to FIG. 4.

Figure 4:
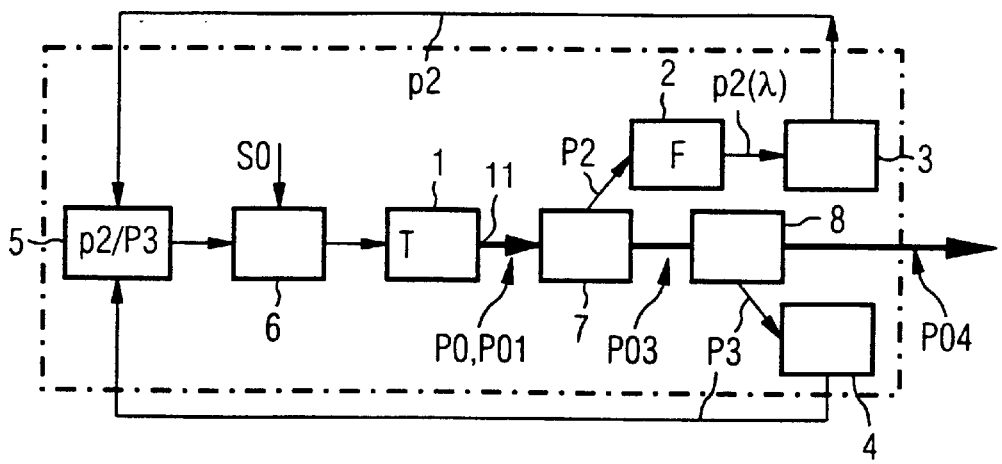

The Figures are not to scale.

DETAILED DESCRIPTION OF THE PREFERRED EMBODIMENTS

In FIGS. 1–4, the same reference numbers are applied to like elements.

In the inventive arrangement that is exemplarily illustrated in the Figures, respectively, which arrangement constitutes an embodiment of the inventive method, the optical filter 2 is essential to the invention, to which filter a power portion P2, which is to be filtered, of the total optical power P0 emitted by the laser 1 is fed and which filters from this supplied power portion P2 a filtered power p2 containing essentially only the wavelength λ to be stabilized.

The power p2 that is filtered out is measured in that it is fed to an optical detector 3 for detection.

Another power portion P3 is derived from the total optical power P0 emitted by the laser 1 such that a ratio p2/P3 between the power p2 that is filtered out and the other power portion P3 is independent of this total power P0. This is the case when both the power p2 that is filtered out and the other power portion P3 are respectively proportional to the total power P0, because then the total power P0 occurs in the ratio p2/P3 both in the denominator and in the numerator and cancels out.

The additional power portion P3 is measured in that it is fed to a further optical detector 4 for detection.

The ratio p2/P3 is formed between the measured, or respectively, detected power p2 that is filtered out and the measured, or respectively, detected additional power portion P3. To this end, a means 5 is provided for purposes of forming this ratio p2/P3.

The formed ratio p2/P3 is compared as an actual value to an adjustable desired value S0 of this ratio p2/P3 and, given a deviation of the actual value p2/P3 from the respectively set desired value S0, an operating parameter of the laser 1, on which the wavelength λ that is to be stabilized depends, is adjusted such that the actual value p2/P3 essentially agrees with the adjusted desired value S0. To this end, a means 6 is provided for purposes of carrying out this comparison as well as such an adjusting of the parameter. The parameter can be the temperature T of the laser 1, for example.

All types of optical filters are suitable as the filter 2, particularly high-passes, low-passes or band-passes comprising a filter edge without ripple.

The means 5 can consist of a conventional quotient generator.

The means 6 is preferably a controller, whereby either analog (Proportional controllers), or better PI-controllers (Proportional integral controller) or PID-controllers, or digital controllers are suitable.

The required steepness of the filtering edge results from the spectral resolution and the capture range of the control unit.

The temperature sensitivity of the filter 2 is usually significantly less than that of the laser 1, e.g. a laser diode, particularly in filters 2 on a glass base, so that over the entire temperature range, the working point remains in the filtering edge of the filter 2 that is used for purposes of control. The temperature monitoring, or respectively, control in the module can then be additionally employed in order to exhaust the temperature dependency of the transmission curve of the filter 2, for instance by a suitable circuit or by a microprocessor control unit.

In the first basic embodiment depicted in FIG. 1, a power portion P2 that is proportional to the total optical power P0, which portion is to be filtered, is fed to the filter 2, so that the power p2 which is filtered out of this and which essentially contains only the wavelength λ that is to be stabilized is proportional to the total power P0.

A residual part of the supplied power portion P2 that is to be filtered, which part is delivered by the filter 2 in addition to the power p2 that is filtered out, is conducted to the additional detector 4 as an additional power portion P3, the sum P3+p2 of this residual part P3 and the power p2 that is filtered out being equal to or at least proportional to the supplied power portion P2 that is to be filtered, so that this additional power portion P3 is also proportional to the total power P0.

In the embodiment according to FIG. 1, the filter 2 consists of a filter which is selected from the group of optical interference filters and Bragg gratings. Such interference filters and Bragg gratings are known.

When this filter 2 is an interference filter in which the filtered-out power p2 is the part of the supplied power portion P2 that is transmitted by the filter 2, for example, then this transmitted power portion p2 is fed to the detector 3, and the remaining part of the supplied power portion P2, which part is reflected by the filter 2, is fed to the additional detector 4 as the additional power portion P3. In the exemplifying embodiment according to FIG. 7, which is described below, such an interference filter is used.

When, on the other hand, the filtered-out power p2 is the part of the supplied power portion P2 that is reflected by the interference filter 2, then this reflected power portion p2 is fed to the detector 3, and the remaining part of the supplied power portion P2, which part is transmitted by the filter 2, is fed to the additional detector 4 as the additional power portion P3.

Figure 5:
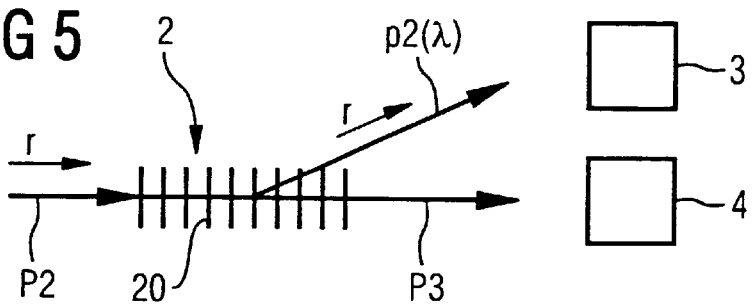
FIGS. 5 and 6 depict a filter in the form of a Bragg grating, or respectively, in the form of a directional coupler or interferometer, in schematic views.

A filter 2 in the form of a known Bragg grating is indicated in FIG. 5 in a very simplified manner. At the grating lines 20 of this grating, a part of the power portion P2 that is to be filtered, which part is fed in a specified direction r—which essentially contains only the wavelength λ to be stabilized and which constitutes the filtered-out power p2—is deflected from this direction r in a different direction r1 the Bragg grating, according to a known method of operation of Bragg gratings, and is fed to the detector 3. The residual part of the supplied power portion P2 that is to be filtered—which part emerges from the grating in the direction r essentially undeflected—is fed to the additional detector 4 as the additional power portion P3. Fiber Bragg gratings are particularly suitable Bragg gratings.

In the embodiment according to FIG. 1, the filter 2 can also consist of a filter that is selected from the group of wavelength-selective optical directional couplers and interferometers and not from the group of the interference filters and Bragg gratings.

Figure 6:
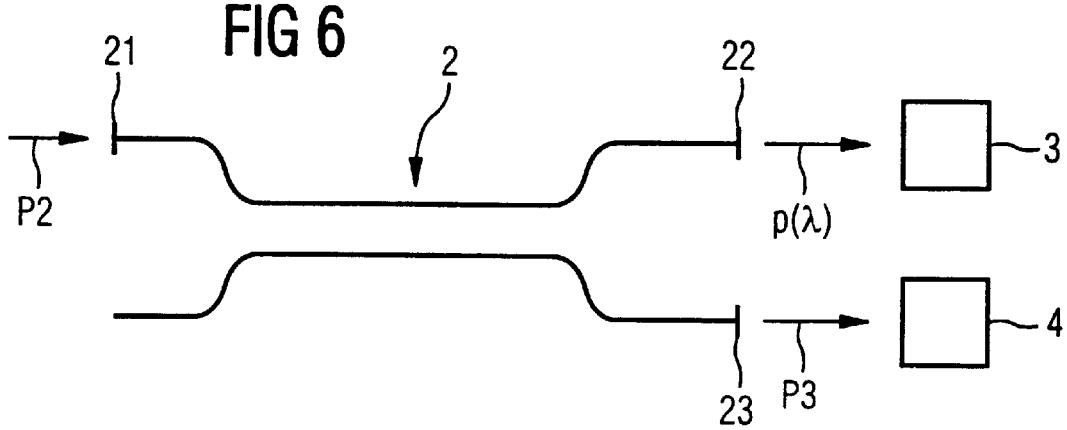

In this case, in accordance with a known construction of such a coupler or interferometer and as illustrated in FIG. 6, this filter 2 comprises an input port 21 for coupling into the filter 2 the supplied power portion P2 which is to be filtered; an output port 22 for coupling out from the filter 2 a part of the supplied power portion P2 (which is to be filtered) essentially containing only the wavelength λ that is to be stabilized, which part forms the filtered-out power p2; and an additional output port 23 for coupling out from the filter 2 the remaining part of the supplied power portion P2 (which is to be filtered), which part forms the additional power part P3. This type of out-coupling from the output ports 22 and 23 is based on the wavelength-selective effect that can be imparted to such couplers and interferometers in known fashion.

The filtered-out power p2 that is coupled out from the output port 22 is fed to the detector 3, and the additional power portion P3 that is coupled out from the other output port 23 is fed to the additional detector 4.

As in the embodiment according to FIG. 1, in the other basic embodiments of the inventive arrangement, which are illustrated in the FIGS. 2 to 4, a power portion P2 that is to be filtered, which portion is proportional to the optical total power P0 of the laser 1, is fed to the filter 2, and the power p2 that is filtered out from this filter 2, which power essentially contains only the wavelength λ to be stabilized, is fed to the detector 3.

In contrast to the embodiment according to FIG. 1, a power portion which is derived from the total optical power P0 and is proportional to this total optical power P0 is fed to additional detector 4 as additional power portion P3, the power portion being separate from the power portion P2 that is to be filtered by the filter 2 and remaining unfiltered by this filter 2.

While, in the embodiment according to FIG. 1, the filter 2 is used in the generating of the additional power portion P3 for the additional detector 4, in the embodiments according to FIGS. 2 to 4, this filter 2 is not used in the generation of the additional power portion P3 for the additional detector 4, but is rather omitted.

The embodiments illustrated in the FIGS. 2 to 4 can be distinguished as follows:

In the embodiments according to FIGS. 2 and 3, the laser 1 has two light exit windows 11 and 12 for the respective emission of a subpower P01, or respectively, P02 of the total optical power P0 generated by the laser 1. One of the two subpowers P01, or respectively, P02 (for instance the subpower P01) from the light exit window 11 is intended for some use, for instance an optical power transmission or an optical transmission of signals or information. The power portion P2 that is to be filtered, which is supplied to the filter 2, and the additional power portion P3, which is fed to the additional detector 4, stems from the other subpower (in the example, the subpower P02, which is not intended for use in this case, but which could be).

In this regard, it is noted that similar relations prevail in the illustrated development of the embodiment according to FIG. 1, for example.

In the embodiment according to FIG. 4, on the other hand, the power portion P2 that is fed to the filter 2, and the additional power portion P3, which is fed to the additional detector 4, stem from an optical power of the laser 1 which is simultaneously intended for use. In this case, a laser 1 can be used which has only one light exit window 11 or 12, from which the total optical power P0, which is intended for use, of the laser 1 exits. But the laser 1 can also have two light exit windows 11 and 12 for the respective emission of a respective subpower P01, or respectively, P02 of the total optical power P0 that is generated by the laser 1, as in the embodiments according to FIGS. 1 to 3, whereby the subpower P01 or the subpower P02 is the power intended for use, from which the power portion P2 which is fed to the filter 2 and the additional power portion P3 which is fed to the additional detector 4 are derived. The respective other subpower P02, or respectively, P01 can be intended for another purpose or likewise for some use.

In any case, the embodiment according to FIG. 4 has the advantage that, even given the use of a laser 1 with two exit surfaces 11 and 12, aging effects influencing the power ratio between the subpowers P01 and P02 which are emitted from the two light exit surfaces 11 and 12 do not affect the inventive wavelength stabilization.

Each of the embodiments according to the FIGS. 2 to 4 is preferably so constructed as to comprise a known wavelength-neutral optical power divider 7, i.e. a divider whose division ratio is independent of the wavelength λ, to which divider an optical power of the laser 1 that is proportional to the total optical power P0 is fed, for instance this total power P0 itself or a subpower P01 or P02 of this total power P0. This divider 7 generates two power portions from the supplied power P0,P01 or P02, one of which is fed to the filter 2 as the power portion P2 that is to be filtered.

With regard to the advantageous and preferred developments and embodiments according to the FIGS. 1 to 4, which are described below, it is assumed that in the developments of the embodiments according to the FIGS. 1 to 3, the laser 1 is a semiconductor laser and has two light exit windows 11 and 12 facing away from each other for respectively emitting of a respective subpower P01 or P02 of the total optical power P0 generated by the laser 1, and that only the subpower P01 or P02 from a light exit window 11 or 12 is intended for use—in the drawing, the subpower P01 from the light exit window 11.

In the development of the embodiment according to FIG. 1, the subpower P02, or respectively, P01 from the other light exit window 12, or respectively, 11, (in the drawing, the subpower P02), which subpower is proportional to the total power P0, is itself fed to the filter 2 as the power portion P2 to be filtered.

The filter 2 splits the power portion P2 that is to be filtered into the filtered-out portion p2, which essentially contains only the wavelength λ that is to be stabilized and which is fed to the detector 3, and the remaining part of this power portion P2 that is to be filtered, which is fed to the additional detector 4 as additional power portion P3.

In the development of the embodiment according to FIG. 2, the subpower P02, or respectively, P01 from the other light exit window 12, or respectively, 11, (in the drawing, the subpower P02), which subpower is proportional to the total power P0, is fed to the wavelength-neutral power divider 7, which splits this subpower P02, or respectively, P01 into two power portions, one of which is fed to the filter 2 as the power portion P2 to be filtered, and the other of which is fed to the additional detector 4 as the additional power portion P3.

The power p2, which is filtered out by the filter 2 from the supplied power portion P2 to be filtered and which essentially contains only the wavelength λ to be stabilized, is fed to the detector 3.

In the development of the embodiment according to FIG. 3, on the other hand, the subpower P01, or respectively, P02 from the light exit window 11 or 12 which is proportional to the total optical power P0 is fed to the wavelength-neutral power divider 7, which splits this subpower P01, or respectively, P02 (the subpower P01 in the drawing) into two portions, one of which is fed to the filter 2 as the power portion P2 to be filtered, and the other of which, referenced P03, is intended for the useful radiation.

The power p2 which is filtered out of the power portion P2 by the filter and which contains essentially only the wavelength λ to be stabilized is fed to the detector 3.

The subpower P02, or respectively, P01 from the other light exit window 12, or respectively, 11, (the subpower P02 in the drawing), which is proportional to the total power P0, is itself fed to the additional detector 4 as the additional power portion P3.

In the development of the embodiment according to FIG. 4, it is assumed that the laser 1 is a semiconductor laser, and that a light exit window 11 or 12 is for the emission of an optical power that is proportional to the total power P0, which is respectively intended for use and which can be the total power P0 itself or a subpower P01 or P02 (in the drawing, the subpower P01 from the light exit window 11).

This optical power P0,P01 or P02 (in the drawing, the power P01), is fed to the wavelength-neutral power divider 7, which splits it into two power portions, one of which, referenced P03, is intended for use.

This power portion P03 is fed to an additional wavelength-neutral power divider 8, which divides this power portion P03 into two power portions in turn, one of which, referenced P04, is intended for use.

The other power portion generated by one of the two power dividers 7 and 8, (for instance by the power divider 7), is fed to the filter 2 as the power portion P2 that is to be filtered, and the other power portion which is generated by the other power divider, (in this case power divider 8), is fed to the additional detector 4 as the additional power portion P3.

The power portion p2, which is filtered out of the supplied power portion P2 that is to be filtered and which essentially contains only the wavelength λ that is to be stabilized, is fed to the detector 3.

FIGS. 7 to 10 depict preferred and advantageous realizations of the above described developments of the embodiments according to the FIGS. 1 to 4, in a sectional view, whereby the optical axes along which the optical powers propagate lie in the plane of projection. These realizations all depict the particular advantage of the invention, which is the simple monolithic integration with the laser 1 in the form of a semiconductor laser.

Accordingly, in each of these realizations, the laser 1 and the underlying embodiment of the inventive arrangement is arranged and developed on the surface 100 of a common substrate 10.

The laser 1 itself is so arranged and developed on this surface 100 that each of its light exit windows 11 and 12 is arranged at a distance a1 from the surface 100, and the optical power P0,P01, or P02 which is emitted from this light exit window 11 and/or 12 propagates in the direction r11 and/or r12 parallel to the surface 100.

If the laser 1 comprises two opposing light exit windows 11 and 12, as is illustrated at least in the embodiments according to the FIGS. 1 to 3, the directions r11 and r12 in which the subpowers P01 and P02 which are emitted by these light exit windows 11 and 12 propagate are also opposite each other.

Figure 7:
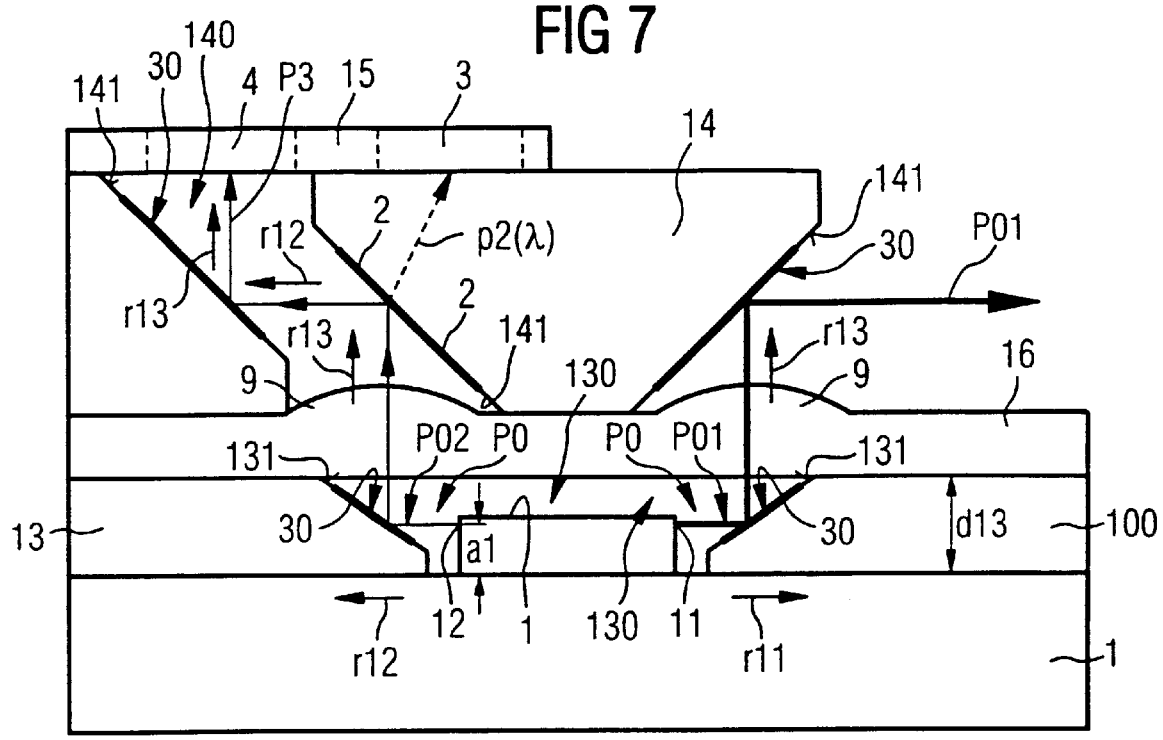
FIG. 7 depicts a schematic sectional view of a realization of a development of the embodiment according to FIG. 1.
Figure 8:
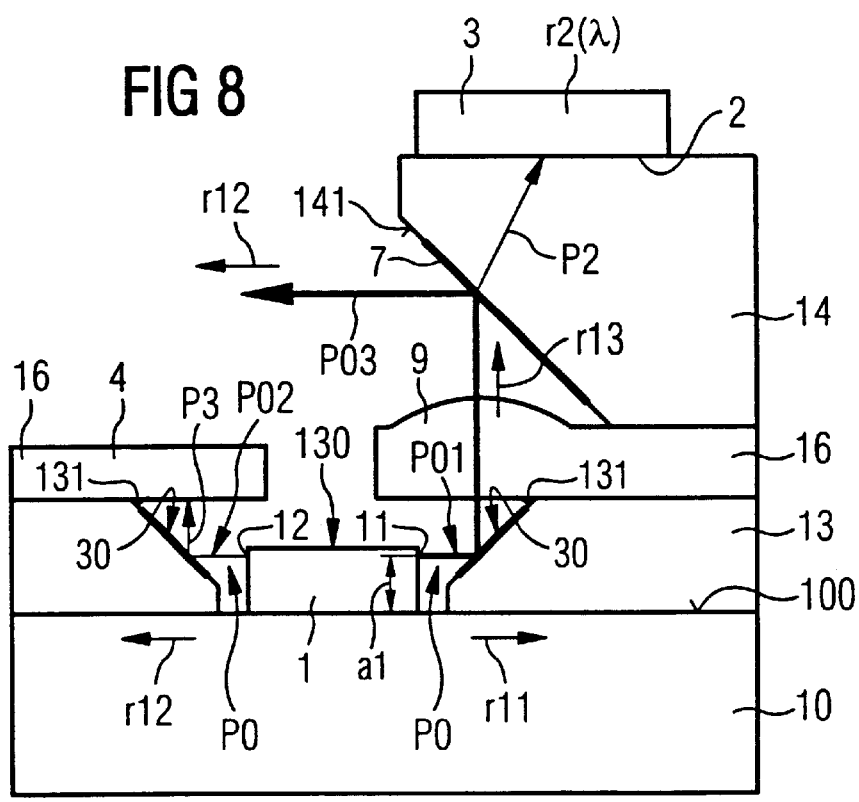
FIG. 8 depicts a schematic sectional illustration of a realization of a development of the embodiment according to FIG. 2.
Figure 9:
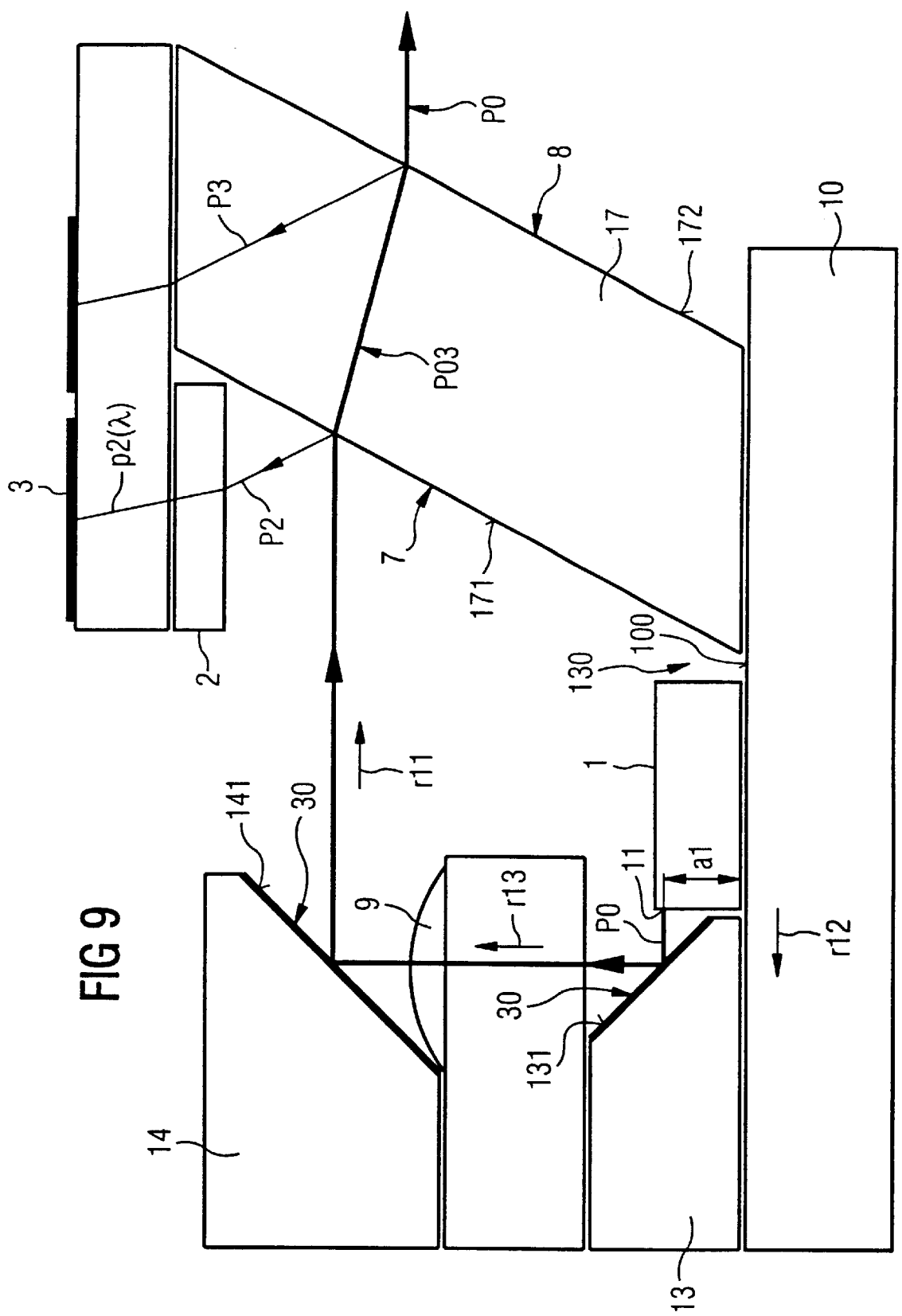
FIG. 9 depicts a schematic sectional illustration of a realization of a development of the embodiment according to FIG. 4.

In the realizations according to FIGS. 7 to 9, a plurality of layers are additionally deposited on the surface 100 for the inventive arrangement 100.

Directly on the surface 100, a first layer 13 is deposited, in which a recess 130 is formed, the surface 100 being exposed and the laser 1 being arranged therein. This layer 13 comprises a thickness d13 that is greater than the distance a1 of each light exit window 11 and 12 of the laser from the surface 100, and the recess 130 comprises an edge face 131 which stands obliquely at an angle to the surface 100 with respect to at least one light exit window 11 and/or 12 and which is impinged by the optical power P0,P01 or P02 emitted from this light exit window 11 and/or 12.

This oblique edge face 131 is mirrored and arranged obliquely to the surface 100 such that it forms a deflecting mirror 30 for deflecting the incident optical power P0, P01 or P02 from the opposite light exit window 11 and/or 12 of the laser 1 upward from the surface 100 of the substrate 10 in the direction r13.

It is common to the realizations according to the FIGS. 7 to 9 that an optical power P0, P01 or P02 which propagates upward in the direction r13 impinges at least one deflecting mirror 30, which deflects incident power in a direction parallel to the surface 100 of the substrate 10, for instance in the direction r11 or r12. This deflecting mirror 30 preferably consists of a mirrored edge face 141, standing obliquely at an angle to the surface 100 of the substrate 10, of an additional layer 14 that is developed on or over the first layer 13.

The angle at which an edge face 131 and/or 141 is arranged obliquely relative to the surface 100 of the substrate 10 preferably amounts to 45°, so that optical power propagating in the direction r11 and r12 or in the direction r13 is respectively deflected 90° by a deflecting mirror 30.

For example, in the realization, which is depicted in FIG. 7, of the development of the embodiment according to FIG. 1 the subpower P01 of the total optical power P0 emitted by the laser 1, which subpower emerges from the right light exit window 11 of the laser 1 and which is intended for use, propagates to the right and impinges at the deflecting mirror 30, which is opposite this light exit window 11, of the layer 13. This deflecting mirror 30 deflects this subpower P01 upward, in the direction r13, to the deflecting mirror 30 of the layer 14, by which mirror it is again deflected in the direction r11, whereupon it is available for use.

The other subpower P02 of the total optical power P0 emitted by the laser 1, which emerges from the left light exit window 12 of the laser 1 and which propagates to the left in the direction r12, is intended for the wavelength stabilization. It impinges first at this deflecting mirror 30 of the layer 13 which is opposite the left light exit window 12. This deflecting mirror 30 deflects this other subpower P02 upward, in the direction r13, to the filter 2, forming the power portion P2 to be filtered.

The filter 2 is developed in the form of a layer-shaped interference filter on an edge face 141 of the layer 14 which is arranged obliquely at an angle to the surface 100 of the substrate 10 and which is averted from the edge face 141 of the layer 14 that forms the deflecting mirror 30 which deflects the subpower P01, and it acts such that, of the supplied power portion 12 to be filtered, the power p2 that is to be filtered out, which essentially contains only the wavelength λ to be stabilized, is transmitted, and the residual part of this power portion P2 is reflected as the additional power portion P3.

The transmitted power p2 is fed through the layer 14 to the detector 3 which is developed on this layer 14.

The reflected additional power portion P3 is to be fed to the additional detector 4.

According to FIG. 7, this feed is realized such that the oblique edge face 141 on which the filter 2 is implemented borders a recess 140 that is developed in the layer 14, being thus slanted such that the additional power portion P3 which is reflected by the filter 2 propagates in this recess 140 in the direction r12 up to an edge face 141 of the recess 140 opposite the filter 2, which face is arranged obliquely at an angle to the surface 100 of the substrate 10, this being mirrored and forming a deflecting mirror 30, which deflects the additional power portion P3 in the direction r13 upward from the surface 100.

A layer 15 is deposited on the layer 14 so as to project over or bridge the recess 140, in which layer 15 the additional detector 4 is arranged and developed in the region of the recess 140 such that the additional power portion P3 impinges thereat.

The detector 3 can advantageously also be arranged in this layer 15.

In the realization, which is illustrated in FIG. 8, of the development of the embodiment according to FIG. 2 the subpower P01 of the total optical power P0 emitted by the laser 1, which emerges from the right light exit window 11 of the laser 1 and is intended for use (as in the realization according to FIG. 7), propagates in the direction r11 to the right and impinges at the deflecting mirror 30 of the layer 13 opposite this light exit window 11. This deflecting mirror 30 deflects this subpower P01 in the direction r13 upward, though not, as in the realization according to FIG. 7, to a deflecting mirror 30, but rather to the wavelength-neutral power divider 7, which divides the supplied subpower P01 into two power portions, one of which is fed to the filter 2 as the power portion P2 to be filtered, and the other portion, referenced P03, is available for use.

The power divider 7 is implemented in the form of a semitransparent mirror on an edge face 141 of the layer 14, which face is arranged obliquely at an angle to the surface 100 of the substrate 10, and it acts such that, of the supplied subpower P01, the power portion P2 that is to be filtered, which is to be fed to the filter 2, is transmitted, and the other power portion P03, which is available for use, is reflected.

The transmitted power portion P2 is fed through the layer 14 to the filter 2 that is implemented on this layer 14. On the filter 2, the detector 3 is arranged, which receives the power p2 that is filtered out by the filter 2, which essentially contains only the wavelength λ to be stabilized.

According to FIG. 8, the oblique edge face 141 at which the power divider 7 is implemented is slanted such that the power portion P03 that is reflected by the power divider 7 propagates from the layer 14 in the direction r12 opposite the direction r11.

The other subpower P02 of the total optical power P0 emitted by the laser 1, which emerges from the left light output window 12 of the laser 1 and which propagates to the left in the direction r12, impinges at the deflecting mirror 30 of the layer 13, which mirror is situated opposite this left light exit window 12. This deflecting mirror 30 deflects this additional subpower P02 upward in the direction r13.

On the layer 13, a layer 16 is deposited, which projects beyond or bridges the recess 130 and in which the additional detector 4 is so implemented and arranged, in the region of the recess 130, that the upwardly deflected subpower P02 impinges thereat as the additional power portion P3.

The layer 16 may not disturb the propagation of the power portion P03 which is reflected by the power divider 7 and is available for use.

In the realization, which is illustrated in FIG. 9, of the development of the embodiment according to FIG. 4 the optical power which emerges from the light exit window 11 of the laser 1 (arranged on the left here) and which is intended for use, which may be the total power P0 of the laser 1 or a subpower P01 of this total power P0, (FIG. 9 depicts only P0), propagates to the left in the direction r12 and impinges at the deflecting mirror 30 of this layer 13 opposite this light exit window 11. This deflecting mirror 30 deflects this power P0 or P01 upward in the direction r13 to the deflecting mirror 30 of the layer 14, by which it is deflected in the direction r11 opposite the direction r12.

The power P0 or P01 propagating in the direction r11 impinges at the wavelength-neutral power divider 7, which splits the supplied power P0 or P01 into two power portions, one of which is intended for the filter 2 as the power portion P2 to be filtered, and the other of which, referenced P03, is intended for use.

The power divider 7 is implemented in the form of a semitransparent mirror on a face 171, which is arranged obliquely at an angle to the surface 100 of the substrate 10, of a body 17 of transparent material such as glass that is arranged on the surface 100, and it acts such that, of the supplied power P0 or P01, the power portion P2, which is to be fed to the filter 2 and filtered, is reflected, and the other power portion P03, which is intended for use, is transmitted.

This other power portion P03 impinges at the additional wavelength-neutral power divider 8, which splits this other power portion P03 into two power portions, one of which to the detector 4 as the additional power portion P3 and the other of which, referenced P04, is available for use.

The additional power divider 8 is likewise implemented in the form of a semitransparent mirror on a face, which is arranged obliquely at an angle to the surface 100 of the substrate 10, of a body of transparent material such as glass that is arranged on the surface 100; preferably according to FIG. 8 on the face 172 of the body 17 which is averted from the face 171, whereby the power divider 8 acts such that, of the supplied power portion P03, the additional power portion P3, which is to be fed to the additional detector, is reflected, and the other power portion, referenced P04, which is available for use, is transmitted.

On the body 17, a carrier plate 18 made of transparent material such as glass is arranged, on which the filter 2 and the first and additional detectors 3 and 4 are secured, whereby the filter 2 filters out the power p2, which contains essentially only the wavelength λ that is to be filtered, from the supplied power portion P2 to be filtered, the power p2 being fed to the detector 3.

For example, the filter 2 is laterally secured on a face 181, which faces the surface 100 of the substrate 10 and which projects beyond the body 17 laterally, of the carrier plate 18 next to the carrier body 17, and the detectors 3 and 4 are arranged on a face 182, which is facing away from the surface 100, of the carrier plate 18; whereby the power p2 that is filtered out by the filter 2 is fed to the first detector 3 through the carrier plate 18, and the additional power portion P3, which is reflected by the additional power divider 8, is fed to the additional detector 4 through the body 7 and the carrier plate 18.

The realization, which is illustrated in FIG. 10, of the development of the embodiment according to FIG. 4 differs from the realization according to FIG. 9 only in that the deflecting mirror 30, and with it layers 13 and 14, are omitted. The total optical power P0 of the laser 1, which emerges from the light exit window 11 (arranged on the right here) and which is intended for use, or the subpower P01 of this total power P0, (only P0 is depicted in this Figure also), propagates to the right in the direction r11 without deflection and is fed directly to the power divider 7.

The laser 1 is secured on the substrate 10 at a sufficient distance from the surface 100.

The power dividers 7 and/or 8 of the realizations according to the FIGS. 8 to 10 preferably comprise a division ratio of 90%, so that 90% of the optical power supplied to the divider is available for use.

In the realization according to the FIGS. 7 to 10, beam-shaping lenses can also be advantageously integrated. In the realizations according to the FIGS. 7 to 9, such lenses, referenced 9, are realized on or in an intermediate layer 16 arranged between the first layer 13 and the additional layer 14, in the region of a recess 130 and/or 140 which is implemented in the layer 13 and/or 14, such that each lens 9 is penetrated by an optical power, such as P0,P01 or P02. In the realization according to FIG. 10, a lens 9 is appropriately arranged directly in front of the light exit window 11 of the laser 1.

A lens 9 is provided for purposes of collimating optical power, for instance the power intended for use, which is usually coupled into a an optical fiber or a system, or for purposes of concentrating or focusing optical power on a detector 3 and/or 4, it being possible for this to be a plano-convex lens made of silicon, for example.

In the realizations according to the FIGS. 7 to 10, the power portion P2 to be filtered impinges obliquely on the filter 2. This must be taken into account in the filter design. In the realizations according to the FIGS. 7 and 8, the angle of incidence onto the filter 2 of the power portion P2 that is to be filtered can be slightly modified by a lateral adjusting of the relevant lens 9 enabling a fine adjustment of the filter curve. The wavelength selectivity of the filter 2 also depends on the beam divergence of the incident power portion P2, among other things; the highest selectivity is achieved when the beam is collimated well.

It is advantageously possible to utilize the inventive method and the inventive arrangement in an optical transmission module of micro-optical construction comprising a semiconductor laser 1 for optical transmission systems.

Although other modifications and changes may be suggested by those skilled in the art, it is the intention of the inventors to embody within the patent warranted hereon all changes and modifications as reasonably and properly come within the scope of their contribution to the art.

We claim:

1. A method for wavelength stabilization of a laser, comprising the steps of:
    feeding a first power portion of a total optical power emitted by said laser to an optical interference filter which is wavelength-selective and which is set at a predetermined wavelength, said interference filter filters out a filtered-out power portion containing essentially only said predetermined wavelength from said first power portion fed to said optical filter,
    deriving an additional power portion from said total optical power emitted by said laser such that a ratio between said filtered-out power portion and said additional power portion is independent of said total optical power,
    measuring said filtered-out power and said additional power portion to provide a measured filtered-out power and a measured additional power portion respectively measured,
    forming said ratio between said measured filtered-out power portion and said measured additional power portion,
    comparing said ratio as an actual value to an adjustable desired value of said ratio, and
    given deviation of the actual value from said desired value, adjusting an operating parameter of said laser on which on the predetermined wavelength depends so that the actual value essentially matches said desired value to stabilize laser at said predetermined wavelength.

2. A method as claimed in claim 1, wherein said first power portion is proportional to said total optical power, and
    wherein said step of deriving said additional power portion includes using a part of said first power portion which is emitted by the interference filter as said additional power portion, a sum of said additional power portion and the filtered-out power portion being at least proportional to said first power portion.

3. A method as claimed in claim 1, wherein said first power portion is proportional to said total optical power of the laser; and further comprising the step of:
    feeding said filtered-out power portion to one detector; and
    feeding said additional power portion to an additional detector, said additional power portion being separated from said first power portion by said interference filter and remaining unfiltered.

4. A method as claimed in claim 1, further comprising the steps:
    adjusting temperature of said laser as the operating parameter.

5. An arrangement for wavelength stabilization of a laser, comprising:
    a wavelength-selective optical interference filter set at a predetermined wavelength, said wavelength-selective optical interference filter being connected to receive a first power portion of a total optical power emitted by the laser, said wavelength-selective optical interference filter filtering out of said first power portion a filtered-out power essentially containing only said predetermined wavelength;
    an optical detector connected to an output of said wavelength-selective optical interference filter to receive said filtered-out power for purposes of detection;
    an additional optical detector to which an additional optical power portion is fed for detection, said additional optical power portion being so derived from said total optical power that a ratio between said filtered-out power and said additional power portion is independent of said total optical power;
    a means for forming said ratio between said filtered-out power and said additional power portion; and
    a means for comparing said ratio as an actual value to an adjustable desired value of said ratio and for adjusting an operating parameter of said laser on which said predetermined wavelength depends, given a deviation of said actual value from said adjustable desired value, such that said actual value essentially agrees with said adjustable desired value to stabilize said laser at said predetermined wavelength.

6. An arrangement as claimed in claim 5, wherein said first power portion is proportional to said total optical power,
    wherein said wavelength-selective optical interference filter having an output from which a part of said first power portion is emitted as said additional power portion;
    wherein a sum of said additional power portion and said filtered-out power is at least proportional to said first power portion.

7. An arrangement as claimed in claim 6, wherein said wavelength-selective optical interference filter having an input port for purposes of coupling into the filter said first power portion; said filter having an output port for coupling out of the filter a power that is filtered out of said first power portion that was coupled in for filtering and that essentially contains only said predetermined wavelength; and said filter having an additional output port for purposes of coupling out of said filter a remaining part of said first power portion that was coupled in for filtering, said remaining part forms the additional power portion, and.

8. An arrangement as claimed in claim 5, wherein said wavelength-selective optical interference filter has an output from which said additional power portion is separated from said first power portion by said wavelength-selective optical filter and remaining unfiltered by said wavelength-selective optical interference filter.

9. An arrangement as claimed in claim 8, further comprising:
- a wavelength-neutral optical power divider to which an optical power of said laser that is proportional to said total optical power is fed and which generates two power portions from said optical power, one of said two power portions being fed to said interference filter as said first power portion.

10. An arrangement as claimed in claim 6, the laser including two light exit windows for purposes of respectively emitting two respective subpowers of said total optical power generated by the laser, further comprising: a second of said subpowers being fed to said interference filter as said first power portion;
- said interference filter splits said first power portion into the filtered-out power, which essentially contains only the predetermined wavelength, and a remaining part of said first power portion forms said additional power portion;
- said detector is connected to receive said filtered-out power; and
- said additional detector is connected to receive said additional power portion which is separated from said filtered-out power.

11. An arrangement as claimed in claim 9, the laser including two light exit windows for purposes of respectively emitting two respective subpowers of said total optical power generated by the laser further comprising:
- said wavelength-neutral divider being connected to receive a second of said subpowers, which is proportional to the total power, said wavelength-neutral divider generates two power portions from said second of said subpowers, one of which is fed to said interference filter as said first power portion and another of which is fed to said additional detector as said additional power portion.

12. An arrangement as claimed in claim 9, the laser including two light exit windows for purposes of respectively emitting two respective subpowers of said total optical power generated by the laser;
- wherein said wavelength-neutral power divider is connected to receive said first subpower, said wavelength-neutral power divider generating two power portions from said first subpower, one of said two power portions being fed to said interference filter as said first power portion.

13. An arrangement as claimed in claim 9, the laser including a light exit window for purposes of emitting an optical power that is proportional to said total optical power, further comprising:
- an additional wavelength-neutral power divider connected to receive a power portion, which, in turn, splits said power portion into two power portions,
- the other power portion that is generated by one of the two power dividers is fed to said interference filter for filtering, and the power, which is filtered out by said interference filter from said power portion and which essentially contains only the predetermined wavelength, is fed to said detector, and
- said additional power portion generated by said other power divider is fed to said additional detector as said additional power portion.

14. An arrangement as claimed in claim 5, further comprising:
- an optical lens through which said optical power is directed.

15. An arrangement as claimed in claim 5, further comprising:
- a deflecting mirror by which said optical power is deflected.

* * * * *